United States Patent
Chan et al.

(10) Patent No.: US 7,955,972 B2
(45) Date of Patent: Jun. 7, 2011

(54) METHODS FOR GROWING LOW-RESISTIVITY TUNGSTEN FOR HIGH ASPECT RATIO AND SMALL FEATURES

(75) Inventors: Lana Hiului Chan, Santa Clara, CA (US); Kaihan Ashtiani, Sunnyvale, CA (US); Joshua Collins, Sunnyvale, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 12/030,645

(22) Filed: Feb. 13, 2008

(65) Prior Publication Data
US 2008/0254623 A1    Oct. 16, 2008

Related U.S. Application Data (63) Continuation-in-part of application No. 11/265,531, filed on Nov. 1, 2005, now Pat. No. 7,589,017, which is a continuation-in-part of application No. 10/815,560, filed on Mar. 31, 2004, now Pat. No. 7,262,125, which is a continuation-in-part of application No. 10/649,351, filed on Aug. 26, 2003, now Pat. No. 7,141,494, which is a continuation-in-part of application No. 09/975,074, filed on Oct. 9, 2001, now Pat. No. 6,635,965.

(60) Provisional application No. 60/904,015, filed on Feb. 27, 2007, provisional application No. 60/292,917, filed on May 22, 2001.

(51) Int. Cl.
*H01L 21/4763* (2006.01)
(52) U.S. Cl. ........ 438/648; 438/679; 438/680; 438/681; 438/685; 257/E23.163; 257/E21.593
(58) Field of Classification Search .................. 438/618, 438/648, 679–681, 685; 257/E23.163, E21.593
See application file for complete search history.

(56) References Cited

U.S. PATENT DOCUMENTS
4,746,375 A    5/1988 Lacovangelo
(Continued)

FOREIGN PATENT DOCUMENTS
WO        WO01/27347        4/2001

OTHER PUBLICATIONS

U.S. Office Action mailed Jun. 27, 2008, from U.S. Appl. No. 11/305,368.
(Continued)

*Primary Examiner* — Michelle Estrada
(74) *Attorney, Agent, or Firm* — Weaver Austin Villeneuve & Sampson LLP (57) ABSTRACT

The present invention addresses this need by providing methods for depositing low resistivity tungsten films in small features and features having high aspect ratios. The methods involve depositing very thin tungsten nucleation layers by pulsed nucleation layer (PNL) processes and then using chemical vapor deposition (CVD) to deposit a tungsten layer to fill the feature. Depositing the tungsten nucleation layer involves exposing the substrate to alternating pulses of a boron-containing reducing agent and a tungsten-containing precursor without using any hydrogen gas, e.g., as a carrier or background gas. Using this process, a conformal tungsten nucleation layer can be deposited to a thickness as small as about 10 Angstroms. The feature may then be wholly or partially filled with tungsten by a hydrogen reduction chemical vapor deposition process. Resistivities of about 14 μΩ-cm for a 500 Angstrom film may be obtained.

22 Claims, 4 Drawing Sheets

U.S. PATENT DOCUMENTS

| | | | |
|---|---|---|---|
| 4,804,560 A | 2/1989 | Shioya et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,326,723 A | 7/1994 | Petro et al. | |
| 5,391,394 A | 2/1995 | Hansen | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,926,720 A * | 7/1999 | Zhao et al. | 438/401 |
| 5,956,609 A | 9/1999 | Lee et al. | |
| 6,001,729 A | 12/1999 | Shinriki et al. | |
| 6,017,818 A | 1/2000 | Lu | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,355,558 B1 | 3/2002 | Dixit et al. | |
| 6,404,054 B1 | 6/2002 | Oh et al. | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,936,538 B2 * | 8/2005 | Byun | 438/680 |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,262,125 B2 | 8/2007 | Wongsenakhum et al. | |
| 7,429,402 B2 * | 9/2008 | Gandikota et al. | 427/248.1 |
| 7,589,017 B2 | 9/2009 | Chan et al. | |
| 7,655,567 B1 | 2/2010 | Gao et al. | |
| 7,691,749 B2 | 4/2010 | Levy et al. | |
| 7,754,604 B2 | 7/2010 | Wongsenakhum et al. | |
| 7,772,114 B2 | 8/2010 | Chan et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0014315 A1 | 1/2004 | Lai et al. | |
| 2004/0044127 A1 | 3/2004 | Okubo et al. | |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0136594 A1 | 6/2005 | Kim | |
| 2006/0094238 A1 | 5/2006 | Levy et al. | |
| 2008/0124926 A1 | 5/2008 | Chan et al. | |
| 2009/0149022 A1 | 6/2009 | Chan et al. | |

OTHER PUBLICATIONS

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

U.S. Office Action mailed Nov. 23, 2005, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Dec. 30, 2005, from U.S. Appl. No. 10/649,351.
Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.
U.S. Office Action mailed Apr. 17, 2006, from U.S. Appl. No. 10/815,560.
U.S. Office Action mailed May 17, 2006, from U.S. Appl. No. 10/984,126.
U.S. Office Action mailed Sep. 28, 2006, from U.S. Appl. No. 10/815,560.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
Humayun et al., "Methods for Forming All Tungsten Contacts and Lines," Novellus Systems, Inc., U.S. Appl. No. 11/963,698, filed Dec. 21, 2007.
Chan et al., "Method for Improving Uniformity and Adhesion of Low Resistivity Tungsten Film," Novellus Systems, Inc., U.S. Appl. No. 11/951,236, filed Dec. 5, 2007.
Notice of Allowance and Fee Due mailed Mar. 12, 2003, from U.S. Appl. No. 09/975,074.
Allowed Claims from U.S. Appl. No. 09/975,074.
Notice of Allowance and Fee Due mailed Jul. 21, 2006, from U.S. Appl. No. 10/649,351.
Allowed Claims from U.S. Appl. No. 10/649,351.
Notice of Allowance and Fee Due mailed Oct. 7, 2004, from U.S. Appl. No. 10/435,010.
Allowed Claims from U.S. Appl. No. 10/435,010.
Notice of Allowance and Fee Due mailed Aug. 25, 2006, from U.S. Appl. No. 10/984,126.
Notice of Allowance and Fee Due mailed Sep. 14, 2005, from U.S. Appl. No. 10/690,492.
Allowed Claims from U.S. Appl. No. 10/690,492.
Notice of Allowance and Fee Due mailed Apr. 24, 2007, from U.S. Appl. No. 10/815,560.
Allowed Claims from U.S. Appl. No. 10/815,560.
U.S. Final Office Action mailed Apr. 28, 2009, from U.S. Appl. No. 11/782,570.
U.S. Office Action mailed Apr. 3, 2009, from U.S. Appl. No. 11/305,368.
U.S. Final Office Action mailed Feb. 26, 2009, from U.S. Appl. No. 11/265,531.
U.S. Notice of Allowance mailed May 4, 2009 from U.S. Appl. No. 11/265,531.
Allowed Claims from U.S. Appl. No. 11/265,531.
U.S. Final Office Action mail Feb. 25, 2009, from U.S. Appl. No. 11/349,035.
U.S. Office Action mailed Jun. 11, 2009, from U.S. Appl. No. 11/963,698.
U.S. Office Action mailed Jun. 4, 2009, from U.S. Appl. No. 11/349,035.
Ken K. Lai and H. Henry Lamb, Precursors for Organometallic Chemical Vapor Deposition of Tungsten Carbide Films, 1995, Chemistry Material, pp. 2284-2292.
U.S. Office Action mailed Aug. 5, 2009, from U.S. Appl. No. 11/951,236.
Ashtiani et al., "Ternary Tungsten-Containing Resistive Thin Films," Novellus Systems, Inc., U.S. Appl. No. 12/363,330, filed Jan. 30, 2009.
Chandrashekar et al., "Method For Depositing Thin Tungsten Film With Low Resistivity And Robust Micro-Adhesion Characteristics," Novellus Systems, Inc., U.S. Appl. No. 12/407,541, filed Mar. 19, 2009.
Chan et al., "Methods for Growing Low-Resistivity Tungsten Film," Novellus Systems, Inc., U.S. Appl. No. 11/265,531, filed Nov. 1, 2005.
U.S. Office Action mailed Oct. 21, 2009 from U.S. Appl. No. 12/202,126.
U.S. Notice of Allowance mailed Nov. 17, 2009 from U.S. Appl. No. 11/305,368.
Allowed Claims from U.S. Appl. No. 11/305,368.
U.S. Final Office Action mailed Nov. 20, 2009 from U.S. Appl. No. 11/349,035.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Allowed Claims from U.S. Appl. No. 11/782,570.
Chan et al., "Methods for Growing Low-Resistivity Tungsten Film1", Novellus Systems Inc., U.S. Appl. No. 12/538,770, filed Aug. 10, 2009.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Dec. 11, 2009, U.S. Appl. No. 12/636,616.
U.S. Office Action mailed Jan. 26, 2010 from U.S. Appl. No. 11/951,236.
U.S. Notice of Allowance mailed Mar. 2, 2010 from U.S. Appl. No. 11/349,035.
Allowed Claims from U.S. Appl. No. 11/349,035.
Danek, et al, "Tungsten Barrier And Seed For Copper Fillled TSV," Novellus Systems, Inc., filed Mar. 12, 2010, U.S. Appl. No. 12/723,532.
Chandrashekar, et al., "Method for Forming Tungsten Contacts and Interconnects with Small Critical Dimensions," Novellus Systems, Inc, filed Apr. 6, 2010, U.S. Appl. No. 12/755,248.
Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.
U.S. Notice of Allowance and Allowed Claims mailed Apr. 6, 2010 from U.S. Appl. No. 11/951,236.
U.S. Office Action mailed May 3, 2010 from U.S. Appl. No. 12/407,541.
U.S. Final Office Action mailed May 7, 2010 from U.S. Appl. No. 12/202,126.
U.S. Office Action mailed Jun. 11, 2010, from U.S. Appl. No. 11/963,698.
Chan et al., "Method for Improving Uniformity and Adhesion of Low Resistivity Tungsten Film," Novellus Systems, Inc., U.S. Appl. No. 12/829,119, filed Jul. 1, 2010.
U.S. Office Action mailed Jun. 11, 2010 from U.S. Appl. No. 11/963,698.
U.S. Office Action mailed Jul. 26, 2010 from U.S. Appl. No. 12/202,126.
International Search Report and Written Opinion mailed Apr. 12, 2010 from Application No. PCT/US2009/055349.
Hoover, Cynthia, "Enabling Materials for Contact Metallization," Praxair Electronic Materials R&D, Jul. 2007, pp. 1-16.
Purchase of ethylcyclopentadienyl)dicarbonylnitrosyltungsten from Praxair in Oct. 2006.
U.S. Final Office Action mailed Oct. 19, 2010 from U.S. Appl. No. 12/407,541.
U.S. Office Action for U.S. Appl. No. 12/538,770 mailed Nov. 23, 2010.

\* cited by examiner

30 Angstrom PNL nucleation layer
Multiple reducing agent/W precursor PNL cycles at low temperature with H2 in background

B

< 20 Angstrom PNL nucleation layer
Multiple reducing agent/W precursor PNL cycles at low temperature with H2 in background

METHODS FOR GROWING LOW-RESISTIVITY TUNGSTEN FOR HIGH ASPECT RATIO AND SMALL FEATURES

CROSS-REFERENCE TO RELATED APPLICATIONS

This application claims priority from U.S. Provisional Patent Application No. 60/904,015, filed Feb. 27, 2007. This application is also a continuation-in-part of U.S. patent application Ser. No. 11/265,531, (now U.S. Pat. No. 7,589,017) filed Nov. 1, 2005, titled "Methods For Growing Low-Resistivity Tungsten Film", by Lana Chan et al., which in turn is a continuation-in-part of U.S. patent application Ser. No. 10/815,560 (now U.S. Pat. No. 7,262,125), filed Mar. 31, 2004, titled "Method of Forming Low-Resistivity Tungsten Interconnects" by Panya Wongsenakhum et al., which in turn is a continuation-in-part of U.S. patent application Ser. No. 10/649,351, filed on Aug. 26, 2003, now U.S. Pat. No. 7,141,494 titled "Method for Reducing Tungsten Film Roughness and Improved Step Coverage," by Sang-Hyeobet Lee, et al., which is in turn a continuation-in-part of U.S. patent application Ser. No. 09/975,074 (now U.S. Pat. No. 6,635,965) filed Oct. 9, 2001, which in turn claims priority from U.S. Provisional Patent Application No. 60/292,917, filed May 22, 2001. All of these applications are incorporated herein by reference in their entireties.

FIELD OF INVENTION

This invention relates to methods for preparing tungsten films. The invention is particularly useful for integrated circuit applications that require thin tungsten films having low electrical resistance.

BACKGROUND

The deposition of tungsten films using chemical vapor deposition (CVD) techniques is an integral part of many semiconductor fabrication processes. The tungsten films may be used to produce low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the bulk layer is formed by the reduction of tungsten hexafluoride ($WF_6$) on the growing tungsten layer. The bulk layer is generally deposited more rapidly than the nucleation layer, but cannot be produced easily and reliably without first forming the nucleation layer.

CVD and other deposition methods can be used to form a thin tungsten nucleation layer. In a CVD technique, the $WF_6$ and reducing gas are simultaneously introduced into the reaction chamber. This produces a continuous chemical reaction of mixed reactant gases that continuously forms tungsten film on the substrate surface. In a typical example, CVD nucleation layers are deposited from $WF_6$—$SiH4$ with an argon carrier gas. In some instances, CVD nucleation performance is enhanced by the presence of $H_2$ in carrier gas mixture. Note that the $WF_6$—$SiH_4$ reaction is much faster than the $WF_6$-$H_2$ reaction due to lower activation energy and greater reactivity. Other deposition methods such as atomic layer deposition (ALD) and pulsed nucleation layer (PNL) techniques may also be used to form nucleation layers.

Advancing technology requires that tungsten electrical connects be increasingly thin yet maintain very low resistance. Hence, it is critical that tungsten deposition process provide tungsten having very low resistivity. CVD-deposited bulk tungsten makes up most of the film, but how the CVD film grows depends on the nucleation film. Although CVD and other methods have been able to deposit nucleation layers, their ability to provide nucleation layers for the deposition of low resistivity tungsten in smaller features with high aspect ratios is limited. What are therefore needed are improved methods for forming a conformal nucleation layer that will lead to low resistivity tungsten films with good step coverage for small features.

SUMMARY OF INVENTION

The present invention addresses this need by providing methods for depositing low resistivity tungsten films in small features and features having high aspect ratios. The methods involve depositing very thin tungsten nucleation layers by pulsed nucleation layer (PNL) processes and then using chemical vapor deposition (CVD) to deposit a tungsten layer to fill the feature. Depositing the tungsten nucleation layer involves exposing the substrate to alternating pulses of a boron-containing reducing agent and a tungsten-containing precursor without using any hydrogen gas, e.g., as a carrier or background gas. Using this process, a conformal tungsten nucleation layer can be deposited to a thickness as small as about 10 Angstroms. The feature may then be wholly or partially filled with tungsten by a hydrogen reduction chemical vapor deposition process. Resistivities of about 14 µΩ-cm for a 500 Angstrom film may be obtained.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the present invention, which pertains to forming thin tungsten films. Preferred methods involve pulsed nucleation layer (PNL) deposition techniques, which will be described in detail below. Modifications, adaptations or variations of specific methods and or structures shown and discussed herein will be apparent to those skilled in the art and are within the scope of this invention.

In a PNL technique, pulses of the reducing agent, purge gases, and tungsten-containing precursors are sequentially injected into and purged from the reaction chamber. The process is repeated in a cyclical fashion until the desired thickness is achieved. PNL is similar to atomic layer deposition techniques reported in the literature. PNL is generally distinguished from atomic layer deposition (ALD) by its higher operating pressure range (greater than 1 Torr) and its higher growth rate per cycle (greater than 1 monolayer film growth per cycle). In the context of this invention, PNL broadly embodies any cyclical process of sequentially adding reactants for reaction on a semiconductor substrate. Thus, the concept embodies techniques conventionally referred to as ALD.

The present invention involves forming a tungsten film by way of a tungsten nucleation layer. In general, a nucleation layer is a thin conformal layer which serves to facilitate the subsequent formation of a bulk material thereon. The nucleation layer may be formed using one or more PNL cycles. Additional discussion regarding PNL type processes can be found in the related U.S. patent application Ser. Nos. 10/435,010, 10/649,351 and 10/690,492, 11/265,531, incorporated herein by reference.

As features become smaller, the tungsten (W) contact or line resistance increases due to scattering effects in the thinner W film. While efficient tungsten deposition processes require tungsten nucleation layers, these layers typically have higher electrical resistivities than the bulk tungsten layers. Thus, to keep the electrical resistance of the overall tungsten film (tungsten nucleation layer and bulk tungsten) low, the tungsten nucleation layer should be kept as thin as possible. A simplified equation describing the total resistance of a tungsten layer is:

$$R_{total}=R_{bulk}+R_{nucleation}=\rho_{bulk}(L_{bulk}/A)+\rho_{nucleation}(L_{nucleation}/A)$$

This is shown in the above simplified equation of total resistance, $R_{total}$, where $\rho$ is the resistivity of the material, L is the length of the layer in the direction of the current flow and A is the cross-sectional area perpendicular to current flow. (It should be noted that contributions to the total resistance are neglected in the above equation). Because the $\rho_{nucleation} > \rho_{bulk}$, the thickness of the nucleation layer should be minimized to keep the total resistance as low as possible. On the other hand, the tungsten nucleation should be sufficiently thick to fully cover the underlying substrate to support high quality bulk deposition. So, to achieve an optimal thickness, the tungsten nucleation layer may be formed in one or more PNL deposition cycles.

Figure 1:
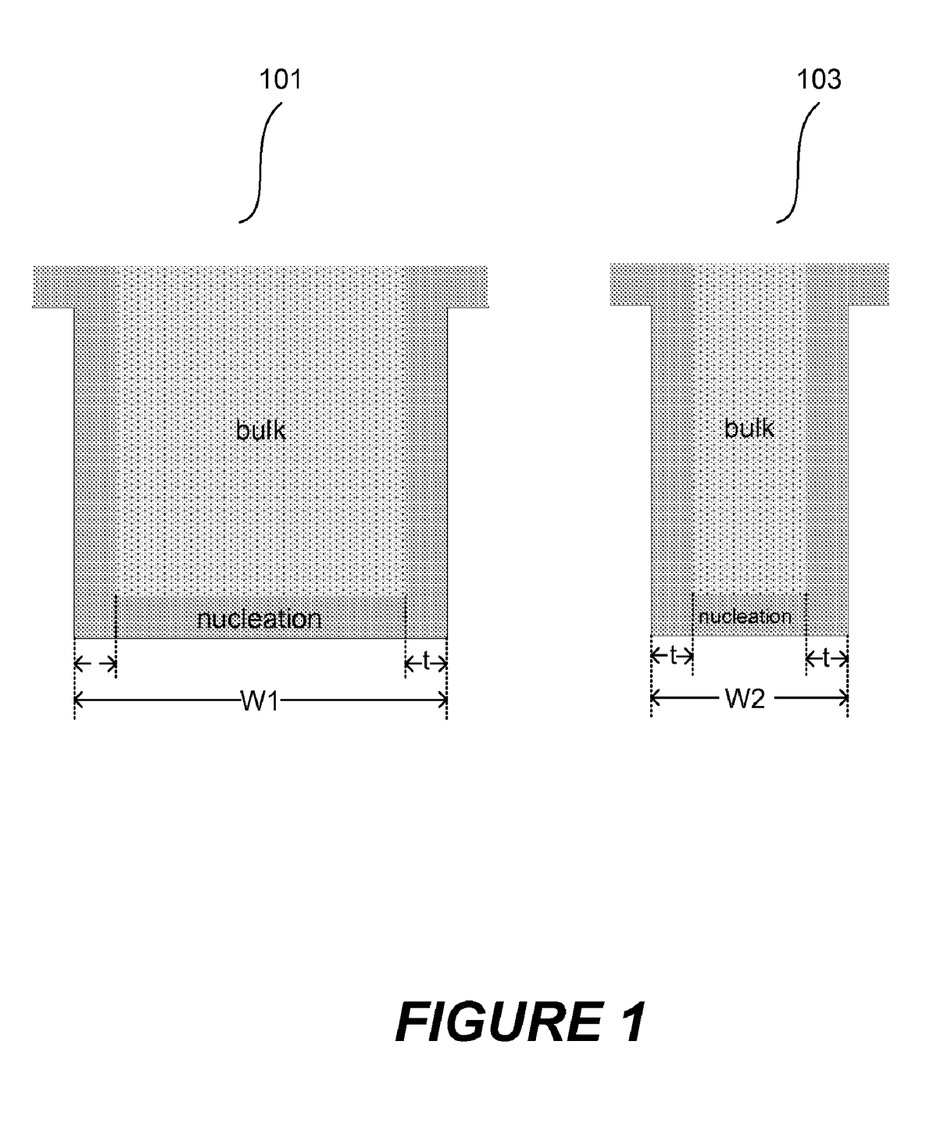
FIG. 1 shows simple cross-sectional diagrams of tungsten deposition in low and high aspect ratio features.

For narrow width and/or high aspect ratio and thin features, obtaining thin nucleation layers is even more critical. FIG. 1 shows a relatively low aspect ratio feature 101 is shown in comparison to a relatively high aspect ratio feature 103. (These features are not drawn to scale but to illustrate the qualitative difference between nucleation layers in high and low aspect ratio features). Here, the thickness t is the same for both features, but the width W2 of feature 103 is much less than width W1 of feature 101 and the nucleation layer takes up a significantly higher percentage of the total volume of the feature. As a result, the nucleation layer has a much high relative contribution to the overall resistance of the feature. Thus, it becomes important to reduce the nucleation layer thickness (for example from a 50 A film to <30 A) for small features (for example a feature having a 10:1 aspect ratio or 400 A opening) in order to reduce the overall stack resistivity. However, current PNL nucleation layers for standard and low resistivity W processes has a limitation of nucleation layer thickness of around 30 A in order to obtain good step coverage and plug fill. Reducing the nucleation layer further using current processes results in degradation of the step coverage.

Thin and uniform nucleation layers are also important for obtaining high quality, void-free tungsten deposition in narrow width and/or high aspect ratio features. Depositing thin nucleation layers with previous processes resulted in nucleation layers only forming on the top of the feature, without depositing a continuous nucleation layer in the bottom of the feature. Most tungsten fill processes fill in from the side as well at the bottom of the feature, so that when there is no nucleation layer at the bottom, CVD film cannot grow from the bottom or from the sidewall near the bottom of the feature. But the top will have some nucleation film, and CVD tungsten grows much faster on the top than the bottom sidewall due to unequal nucleation layer deposition. This causes a pinch off at the top leaving a void at the bottom. Previous processes compensated for this problem by doing a thicker nucleation layer. But the nucleation layer has higher resistivity and occupies a larger percentage of the total volume when the feature is smaller as described above. Previous low resistivity tungsten nucleation layer processes (carried out at low temperature) were unable to deposit even thicker nucleation layers at the bottom of high aspect ration and small features.

Figure 2:
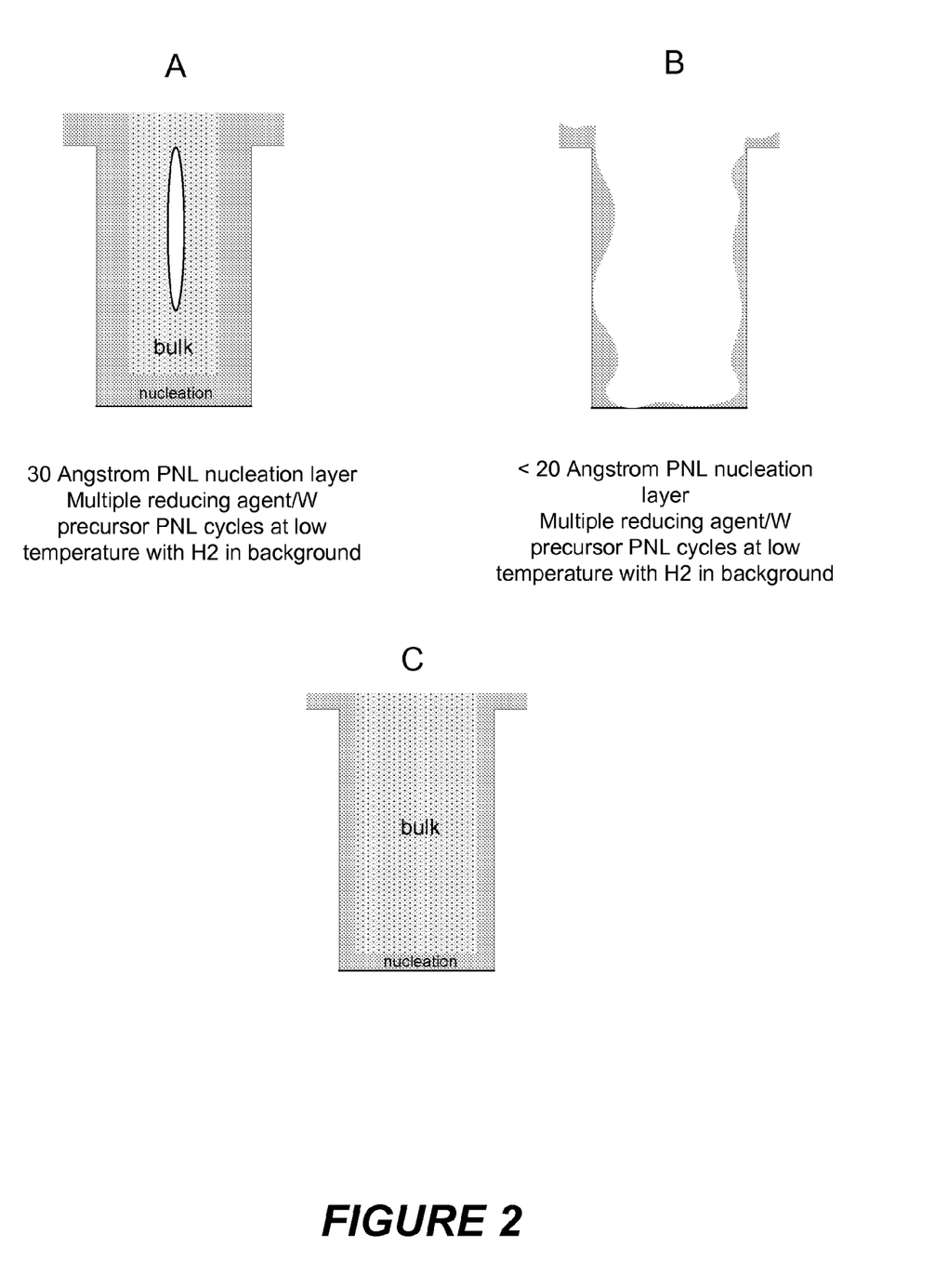
FIGS. 2A-2C are simple cross-sectional diagrams illustrating deposition of tungsten in a narrow width feature using various processes.

FIG. 2 shows tungsten deposition in high aspect ratio features using various processes. First, in FIG. 2A, tungsten deposition is shown using a low-resistivity tungsten process, which is able obtain good feature fill for aspect ratios of 10:1 or lower and features widths of above about 400 Angstroms. This process involves one or more PNL cycles at low temperature (e.g., about 300 C) to deposit the nucleation layer followed by CVD bulk deposition. Multiple reducing agent pulse/tungsten-precursor pulse cycles are performed to deposit the nucleation layer. Hydrogen is typically run in the background and/or as a carrier gas (for the reducing agent and/or tungsten precursor) during the PNL process. Descriptions of various low resistivity tungsten deposition processes are in above-referenced U.S. application Ser. No. 11/265,531. These processes are able to good step coverage and deposit nucleation layers having thicknesses as low between about 20 and 30 Angstroms. In higher aspect ratios and small features, however, even nucleation layers as thin as 20 Angstroms be too thick to achieve good gap fill. FIG. 2A is a rough schematic of a feature with a nucleation layer of 30 Angstroms, which contains a void. (The schematic is not shown to scale).

Depositing thinner nucleation layers with these processes, e.g., by reducing the number of PNL steps, results in nucleation layers without good step coverage. Tungsten distribution is uneven in the feature and may not fully cover the feature. As a result, the nucleation layer is not thick enough to support quality bulk deposition. FIG. 2B shows a rough schematic of a feature with patchy nucleation layer deposition. Step coverage is very poor. Subsequent bulk deposition (now shown) is very poor with voids.

The processes described herein provide very thin nucleation layers having good step coverage—optimal characteristics. An example of a resulting feature is shown in FIG. 2C. The films also have lower resistivities than previously obtainable. Although applicable to high aspect ratio features, the methods described herein may also be used in other applications to deposit ultra-thin tungsten nucleation layers having low resistivity.

Embodiments described herein achieve good step coverage and low resistivity W film with as little as 12 A of a nucleation layer for very aggressive features. This is compared to conventional PNL nucleation deposition processes that fail to give good step coverage and W plug fill with such thin nucleation layers. In addition, the bulk resistivity of the resulting PNL nucleation film is less than that of the standard PNL process. The combination of lower bulk resistivity and thinner nucleation thickness gives lower stack resistivity than the standard process. For example, for a 20 Angstrom nucleation layer, the bulk resistivity using embodiments described herein is about 50 μΩ-cm, compared to about 75 μΩ-cm using the standard process.

The inventors have recognized that running hydrogen in the background or as a carrier gas—as is conventionally done in processes such as described above with reference to FIG. 2A—results in a higher deposition rate and thicker nucleation layer deposited. This is true even at the low temperatures used to deposit low resistivity tungsten. It is believed that in essence the reaction becomes more CVD-like, resulting in decreased step coverage. Without being bound by a particular theory it is believed that by alternating PNL boron-containing reducing agent/tungsten-containing precursor pulses without any hydrogen present, the reactants are pushed down better into high aspect ratio features.

Figure 3:
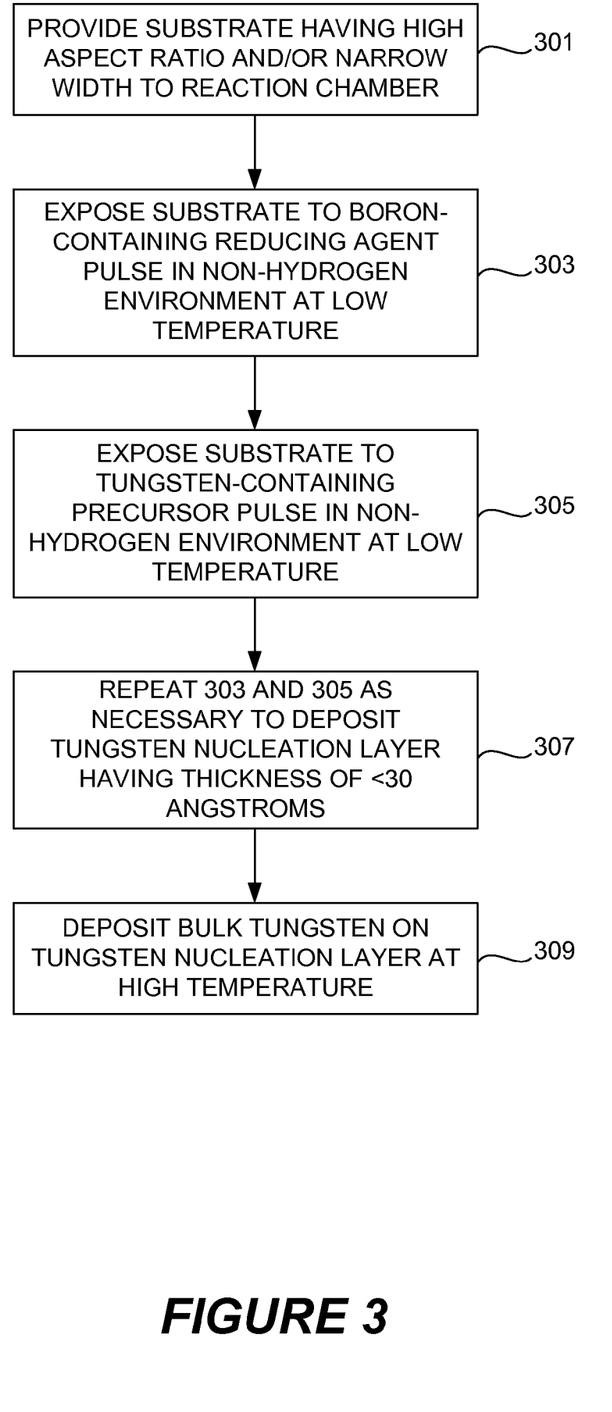
FIG. 3 is a process flow sheet showing relevant operations of methods according to various embodiments of the present invention.

FIG. 3 is a flow chart depicting one process flow in accordance with certain embodiments of the present invention. Initially, a substrate is provided and positioned in a reaction chamber as indicated by a process block 301. As mentioned previously, in many embodiments the substrate is a partially fabricated electronic device (e.g., a partially fabricated integrated circuit). Specific applications of the invention are be described further below. The substrate contains a feature that has a high aspect ratio and/or narrow width.

High aspect ratios range from 5:1-30:1. In certain embodiments, the aspect ratio is at least 10:1 or 20:1. Features having widths as narrow as 300-400 Angstroms also benefit from this process. In some cases, both the feature has both a high aspect ratio and a narrow width, but features having only one of these geometric characteristics benefit from the processes. For example, in one embodiment, a low resistivity tungsten layer is deposited in a feature having a width around 500 Angstrom and aspect ratio of about 30:1—a geometry at which high quality low resistivity tungsten by processes described above with reference to FIG. 2A is not possible.

Next, as indicated by a process block 303, the substrate is exposed to a boron-containing reducing agent to form a boron-containing layer on the substrate surface. For low-resistivity applications, boron-containing reducing agents are used. However, in certain embodiments, a silane may be used in place of the boron-containing reducing agent to achieve good step coverage in high aspect ratio and/or small features, without the benefit of the low resistivity tungsten.

The boron-containing layer is often a layer of elemental boron, though in some embodiments, it may contain other chemical species or impurities from the boron-containing species itself or from residual gases in the reaction chamber. Any suitable boron-containing species may be used, including borane ($BH_3$), diborane ($B_2H_6$), triborane, etc. Examples of other boron-containing species include boron halides (e.g., $BF_3$, $BCl_3$) with hydrogen.

Substrate temperature is low—below about 35° C., for example between about 250 and 350 C or 250 and 325 C. In certain embodiments, the temperature is around 300 C. Frequently, diborane is provided from a diluted source (e.g., 5% diborane and 95% nitrogen). Diborane may be delivered the reaction chamber using other or additional carrier gases such as nitrogen, argon, and/or silane. Importantly, no hydrogen is used.

Once the boron-containing layer is deposited to a sufficient thickness, the flow of boron-containing species to the reaction chamber is stopped and the reaction chamber is purged with a carrier gas such as argon, hydrogen, nitrogen or helium. In certain embodiments, only argon is used at the carrier gas. The gas purge clears the regions near the substrate surface of residual gas reactants that could react with fresh gas reactants for the next reaction step.

Referring back to FIG. 3, the next operation 305 involves contacting the substrate with a tungsten-containing precursor to form a portion of the tungsten nucleation layer. Any suitable tungsten-containing precursor may be used. In preferred embodiments the tungsten-containing precursor is one of $WF_6$, $WCl_6$ and $W(CO)_6$. The tungsten-containing precursor is typically provided in a dilution gas, such as argon, nitrogen, or a combination thereof. As with the boron-containing precursor pulse, the tungsten-containing precursor is delivered in a non-hydrogen environment. The substrate temperature is low—below about 350 C, for example between about 250 and 350 C or 250 and 325 C. In certain embodiments, the temperature is around 300 C. Tungsten-containing precursor dosage and substrate exposure time will vary depending upon a number factors. In general, the substrate is preferably exposed until the adsorbed boron species is sufficiently consumed by reaction with the tungsten-containing precursor to produce a portion of the tungsten nucleation layer. Thereafter, the flow of tungsten-containing precursor to the reaction chamber is stopped and the reaction chamber is purged. The resulting portion of tungsten nucleation layer deposited in one boron-containing reducing agent/tungsten-containing precursor PNL cycle is typically about five Angstroms Returning again to FIG. 3, the low temperature boron-containing reducing agent pulse and tungsten precursor pulse operations are repeated to build up the tungsten nucleation layer in an operation 307. Typically between about 3-7 PNL cycles are required to deposit the very thin nucleation layer. Depending on the substrate, the first one or two cycles may not result in thickness gain due to nucleation deloay. As described previously, the tungsten nucleation layer should be sufficiently thin so as to not unduly increase the overall tungsten film, but sufficiently thick so as to support a high quality bulk tungsten deposition. The process described above is able to deposit a tungsten nucleation layer that can support high quality bulk deposition as low as about 10 Angstroms in the high aspect ratio and/or narrow width feature. The thickness of the deposited nucleation layer is typically between about 10 and 30 Angstroms.

Temperature is one of the process conditions that affects the amount of tungsten deposited. Others include pressure, flow rate and exposure time. As discussed above, in many embodiments, maintaining temperatures at or below about 35° C. results in less material deposited during a cycle than in previously described tungsten nucleation layer deposition processes. This in turn provides lower resistivity. These PNL steps are generally performed at low temperature, e.g., below about 45° C. and in some embodiments below about 35° C., and may result in less material deposited during a cycle than in previously described tungsten nucleation layer deposition processes. In some embodiments, temperatures may be about 20° C. Because of this, for most applications of the invention, the desired thickness of the tungsten nucleation layer requires more than one PNL cycle.

Once the tungsten nucleation layer has reached the desired thickness, the tungsten nucleation layer is fully formed and next a bulk tungsten layer is deposited in the feature in a process operation 309. In many embodiments the bulk tungsten is deposited using a CVD process. CVD processes rapidly produce low resistivity films. Any suitable CVD process may be used with any suitable tungsten-containing precursor. In some embodiments the same tungsten-containing precursor used in the PNL processes for forming the tungsten nucleation layer is use—typically one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane or a mixture of hydrogen and silane or a mixture of hydrogen and borane (such as diborane). Non-CVD process can also be employed to form the bulk layer. These include ALD/PNL and physical vapor deposition (PVD).

The bulk tungsten can be deposited to any thickness. Tungsten interconnect lines for integrated circuit applications may have a total thickness (tungsten nucleation layer and bulk tungsten) of between about 20 and 1,000 Angstroms. For a typical bit line, the total tungsten film thickness typically is no more than about 600 Angstroms. The resulting tungsten film will preferably have a resistivity of no greater than about 30 $\mu\Omega$-cm. Resistivity depends on how much of the total thickness is due to the nucleation layer. The resistivity for 500 Å film (nucleation+CVD tungsten) deposited using a PNL nucleation deposition process as described with reference to FIG. 2A is about 18 $\mu\Omega$-cm. Using the process described above with reference to FIG. 3, the resistivity for a 500 Å film is about 14 $\mu\Omega$-cm.

After the tungsten film is deposited to a sufficient thickness, the process flow of FIG. 1 is complete. While the process parameters can be varied in order to influence the thickness of the nucleation layer formed at a particular cycle of the process, it has been found that depositing less material per cycle may improve step coverage, adhesion and/or resistivity. For this reason, deposition temperature is maintained at or less than about 350 C, though as discussed above, higher temperatures may also be used during the PNL deposition steps according to some embodiments.

Using the methods described herein, ultra-thin W nucleation layer (e.g., <20 Å) that still give good plug fill are achieved. This was previously unattainable except with a nucleation layer >20 Å. In addition, due to lower bulk resistivity of the PNL film itself, the overall contact resistance is improved further. Overall contact and trench line resistance may be reduced by 50%.

The following processes are examples of processes that may be used to fill high aspect ratio features with tungsten, resulting in good gap fill and low resistivity.

Example 1

A W nucleation layer was formed in a feature having an AR of 30:1 and a 0.15 μm opening the following pulsed nucleation layer process:
5 Torr, 300 C, $B_2H_6$ dose (7.5 sec.), 10 sec. purge, $WF_6$ dose (10 sec)
A W bulk layer was then formed using a CVD process ($H_2$-$WF_6$) at 80 Torr and 395 C.
The thickness of the nucleation layer was about 80 Angstroms. Total thickness was 2000 Angstroms. Resistivity was of the film as measured on a blanket wafer was 11 $\mu\Omega$-cm. Step coverage was greater than 90%.

Example 2

A W nucleation layer was formed in a feature having a 10:1 AR and a 0.075 μm opening using the following pulsed nucleation layer process:
40 Torr, 300 C, $B_2H_6$ dose (1 sec.), 3 sec. purge, $WF_6$ dose (0.5 sec), 3 sec purge (5 cycles)
A W bulk layer was then formed using a CVD process ($H_2$-$WF_6$) at 40 Torr and 395 C.
The thickness of the nucleation layer was about 20 Angstroms. Total thickness was 2000 Angstroms. Resistivity was of the film as measured on a blanket wafer was 11 $\mu\Omega$-cm. Step coverage was greater than 90%.

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

In one example, after a first thickness of tungsten deposited, the wafer is moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of tungsten nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten-containing gas. These stations also can provide for the simultaneous delivery of carrier gases and/or hydrogen with the dedicated gases. Thus, tungsten is deposited by moving wafers from station to station such that the wafer is sequentially exposed to the reducing gases and then the tungsten-containing gases until the desired thickness of tungsten is obtained.

Applications

The present invention may be used to deposit thin, low resistivity tungsten layers for many different applications. One preferred application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required.

The invention is also focuses on low resistivity, tungsten layers having relatively thin proportions, typically on the order of 500 angstroms or less, preferably, 300 angstroms or less. But more generally, the invention applies to a broader range of tungsten layers, including those with thicknesses of between about 5 angstroms to 1000 angstroms.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Figure 4:
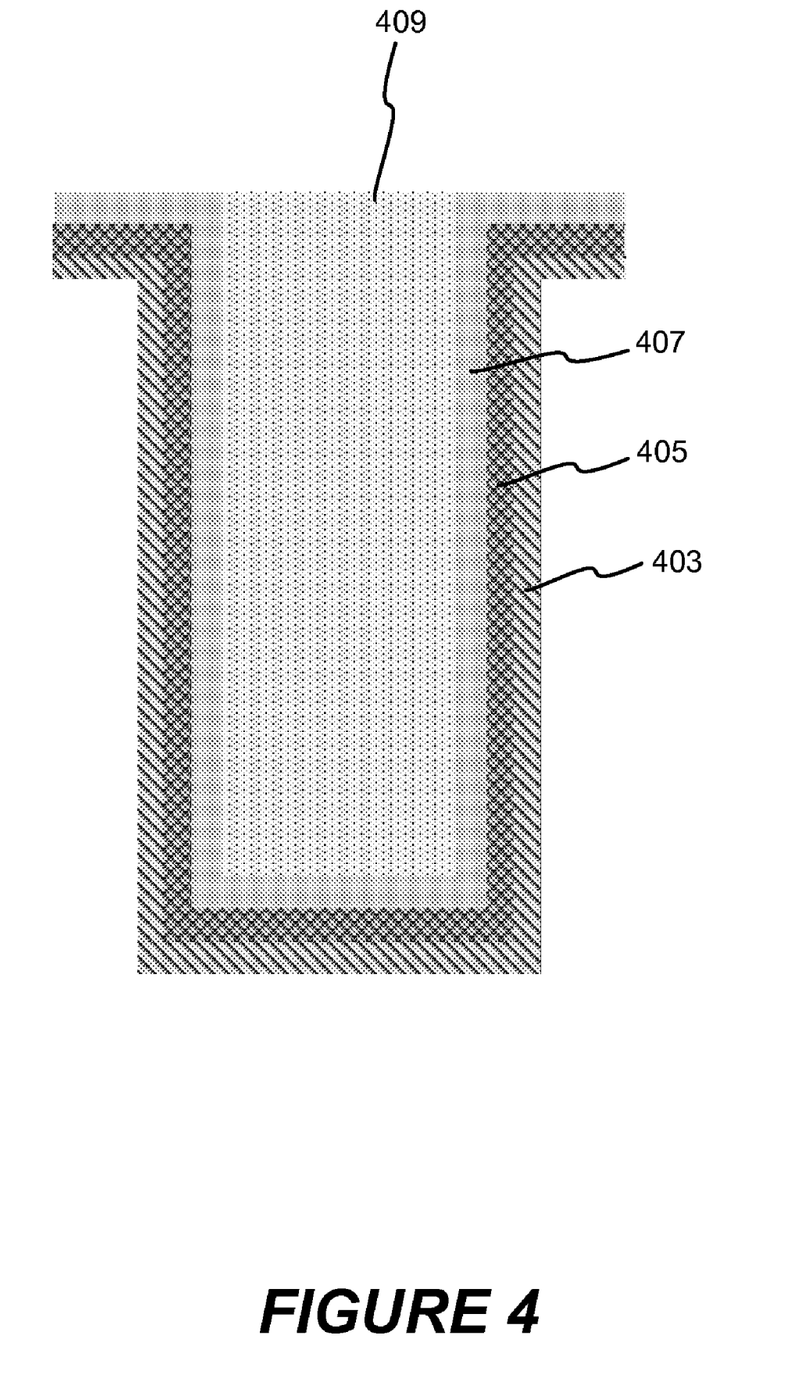
FIG. 4 is a simple cross-sectional diagram of a film stack including a titanium adhesion layer together with a tungsten nucleation layer and a tungsten bulk layer formed in accordance with this invention.

FIG. 4 is a cross-section illustration of a film stack that can be formed using methods of the invention. The film stack may represent interconnect applications as described previously. The film stack of FIG. 4 is formed in an underlying substrate having a feature tungsten is to be deposited. The feature which may be a single component or more commonly a complex multi-feature structure having various conductive, insulating, and semiconductor components. For example, the substrate may have a top layer comprising silicon or a dielectric such as silicon dioxide. Contacting the substrate is, in the following order, a titanium layer 403, a titanium nitride layer 405, a tungsten nucleation layer 407 (formed in accordance with this invention) and a tungsten bulk layer 409. Titanium layer 403 is typically deposited by a CVD process which provides reasonably good adhesion to the underlying substrate 401. Titanium nitride layer 405 is typically deposited using CVD or PVD methods and is used to protect the underlying titanium and/or silicon from exposure to tungsten hexafluoride (WF$_6$) during subsequent tungsten deposition. It has been found that WF$_6$ reacts very aggressively and sometimes explosively with titanium. Tungsten nucleation layer 407 and tungsten bulk layer 409 are formed in accordance with the methods of the present invention as described above. In interconnect applications as described above, layers 403, 405, 407 and 409 are all etched to form interconnect lines. In another embodiment, a tungsten nitride layer is employed instead of the Ti/TiN layer.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of forming a tungsten layer in a small width feature, comprising:
   providing a substrate having a feature with an opening width of no more than about 400 Angstroms
   forming a conformal tungsten nucleation layer in at least the feature by alternating pulses of a boron-containing reducing agent and a tungsten containing precursor at a substrate temperature of between about 250-350° C., wherein no hydrogen is flowed during or between the pulses;
   after forming the conformal tungsten nucleation layer, heating the substrate to thereby raise the substrate temperature to at least about 375° C.; and
   after raising the substrate temperature to at least about 375° C., substantially filling the feature with a tungsten bulk layer by simultaneously exposing the substrate to a tungsten-containing precursor and hydrogen at a substrate temperature of at least about 375° C. to thereby deposit tungsten by a chemical vapor deposition process in at least the feature.

2. The method of claim 1 wherein the substrate temperature during formation of the tungsten nucleation layer is between about 250° C. and 325° C.

3. The method of claim 1 wherein the substrate temperature during formation of the tungsten nucleation layer is about 300° C.

4. The method of claim 1 wherein the tungsten nucleation layer is deposited to a total thickness of between about 10-20 Angstroms.

5. The method of claim 1 wherein the tungsten nucleation layer is deposited to a total thickness of between about 10-15 Angstroms.

6. The method of claim 1 wherein the aspect ratio of the feature is at least about 10:1.

7. The method of claim 1 wherein the feature has an opening width of no more than about 300 Angstroms.

8. The method of claim 1 wherein the substrate temperature during the chemical vapor deposition process is about 395° C.

9. The method of claim 1 wherein the total thickness of tungsten deposited is about 500 Angstroms.

10. The method of claim 9 wherein the resistivity of the deposited film is no more than about 14 μΩ-cm.

11. A method of forming a tungsten layer in a small width feature, comprising:
    providing a substrate having a feature with an aspect ratio of at least 10:1;
    forming a conformal tungsten nucleation layer in at least the feature by alternating pulses of a boron-containing reducing agent and a tungsten containing precursor at a substrate temperature of between about 250° C.-350° C., wherein no hydrogen is flowed during or between the pulses;
    after forming the conformal tungsten nucleation layer, heating the substrate to thereby raise the substrate temperature to at least about 375° C.; and
    after raising the substrate temperature to at least about 375° C. substantially filling the feature with tungsten with a tungsten bulk layer by simultaneously exposing the substrate to a tungsten-containing precursor and hydrogen at a substrate temperature of at least about 375° C. to thereby deposit tungsten by a chemical vapor deposition process in at least the feature.

12. The method of claim 11 wherein the substrate temperature during formation of the tungsten nucleation layer is between about 250° C. and 325° C.

13. The method of claim 11 wherein the substrate temperature during formation of the tungsten nucleation layer is about 300° C.

14. The method of claim 11 wherein the tungsten nucleation layer is deposited to a total thickness of between about 10-20 Angstroms.

15. The method of claim 11 wherein the tungsten nucleation layer is deposited to a total thickness of between about 10-15 Angstroms.

16. The method of claim 11 wherein the aspect ratio of the feature is at least about 20:1.

17. The method of claim 11 wherein the feature has an opening width of no more than about 400 Angstroms.

18. The method of claim 11 wherein the substrate temperature during the chemical vapor deposition process is about 395° C.

19. The method of claim 11 wherein the total thickness of tungsten deposited is about 500 Angstroms.

20. The method of claim 19 wherein the resistivity of the deposited film is no more than about 14 $\mu\Omega$-cm.

21. The method of claim 1 wherein the aspect ratio of the feature positioned is the deposition station is at least 10:1.

22. A method, comprising:
providing a substrate having a feature with an opening width of no more than about 400 Angstroms and/or an aspect ratio of at least about 10:1 in a chamber; and
forming a conformal tungsten nucleation layer in at least the feature by alternating pulses of a boron-containing reducing agent and a tungsten containing precursor at a substrate temperature of between about 250-350° C., wherein no hydrogen is flowed in the chamber during or between the pulses and the conformal nucleation layer is formed by a saturated, surface growth mechanism in which reactants are absorbed onto the substrate surface; wherein step coverage of the conformal tungsten nucleation layer is at least about 90%.

* * * * *